(12) United States Patent
Gallegos et al.

(10) Patent No.: US 7,851,928 B2
(45) Date of Patent: Dec. 14, 2010

(54) SEMICONDUCTOR DEVICE HAVING SUBSTRATE WITH DIFFERENTIALLY PLATED COPPER AND SELECTIVE SOLDER

(75) Inventors: Bernardo Gallegos, The Colony, TX (US); Donald C. Abbott, Norton, MA (US)

(73) Assignee: Texas Instruments Incorporated, Dallas, TX (US)

( * ) Notice: Subject to any disclaimer, the term of this patent is extended or adjusted under 35 U.S.C. 154(b) by 385 days.

(21) Appl. No.: 12/136,231

(22) Filed: Jun. 10, 2008

(65) Prior Publication Data

US 2009/0302463 A1    Dec. 10, 2009

(51) Int. Cl.
*H01L 23/52* (2006.01)
*H01L 23/48* (2006.01)
*H01L 29/40* (2006.01)

(52) U.S. Cl. .............. 257/779; 257/E23.021; 257/780; 257/781; 257/786; 438/612

(58) Field of Classification Search .......... 257/E21.505, 257/E23.01, E23.021, E23.069, 706, 707, 257/723, 737, 774, 778–781, 784, 786; 438/118, 438/612; 174/255, 260, 261; 361/771
See application file for complete search history.

(56) References Cited

U.S. PATENT DOCUMENTS

| | | | | |
|---|---|---|---|---|
| 5,450,283 A * | 9/1995 | Lin et al. | ..................... | 361/704 |
| 5,726,489 A * | 3/1998 | Matsuda et al. | ............. | 257/659 |
| 5,915,169 A * | 6/1999 | Heo | ............................. | 438/118 |
| 6,075,710 A * | 6/2000 | Lau | ............................ | 361/760 |
| 6,143,991 A * | 11/2000 | Moriyama | ................... | 174/261 |
| 6,249,053 B1 * | 6/2001 | Nakata et al. | ............... | 257/738 |
| 6,317,333 B1 * | 11/2001 | Baba | ......................... | 361/795 |
| 6,365,978 B1 * | 4/2002 | Ibnabdeljalil et al. | ....... | 257/786 |
| 6,372,540 B1 * | 4/2002 | Huemoeller | ................ | 438/106 |
| 6,434,017 B1 * | 8/2002 | Iwabuchi | .................... | 361/771 |
| 6,448,665 B1 * | 9/2002 | Nakazawa et al. | .......... | 257/789 |
| 6,476,331 B1 * | 11/2002 | Kim et al. | .................... | 174/261 |
| 6,586,830 B2 * | 7/2003 | Saito | .......................... | 257/700 |
| 6,657,296 B2 * | 12/2003 | Ho et al. | ..................... | 257/720 |
| 6,855,626 B2 * | 2/2005 | Sato et al. | ................... | 438/622 |
| 7,253,503 B1 * | 8/2007 | Fusaro et al. | ............... | 257/668 |
| 7,339,264 B2 * | 3/2008 | Shibata | ....................... | 257/686 |
| 7,397,129 B2 * | 7/2008 | Lee | ............................. | 257/774 |
| 7,405,486 B2 * | 7/2008 | Kato | .......................... | 257/777 |
| 7,514,783 B2 * | 4/2009 | Shimokawa et al. | ........ | 257/706 |
| 7,728,421 B2 * | 6/2010 | Tanoue | ....................... | 257/692 |
| 2004/0201396 A1 * | 10/2004 | Pierson et al. | .............. | 324/765 |
| 2005/0111205 A1 * | 5/2005 | Sumi et al. | .................. | 361/760 |

(Continued)

*Primary Examiner*—Chris Chu
(74) *Attorney, Agent, or Firm*—Yingsheng Tung; Wade J. Brady III; Frederick J. Telecky, Jr.

(57) ABSTRACT

A semiconductor device having an insulating substrate with differentially plated metal and selective solder. Chip 221 with contact studs 223 is attached onto the traces 203 on tape 101. The traces, which are unprotected by soldermask 110, have solder on the top surface, but not on the sidewalls. The sidewalls of the traces are at right angles to the trace top, giving the trace a rectangular cross section. Consequently, the area for attaching stud 223 is maximized. At the same time, the differential plating method of trace metal 203 and through-hole metal 206 allows different metal thicknesses and provides independent control of the trace aspect ratio for low electrical resistance and trace fatigue.

20 Claims, 10 Drawing Sheets

U.S. PATENT DOCUMENTS

2005/0263874 A1* 12/2005 Shimizu et al. ............. 257/700
2006/0175699 A1* 8/2006 Lee ........................... 257/700
2007/0013048 A1* 1/2007 Sunohara et al. ............ 257/698

* cited by examiner

US 7,851,928 B2

SEMICONDUCTOR DEVICE HAVING SUBSTRATE WITH DIFFERENTIALLY PLATED COPPER AND SELECTIVE SOLDER

FIELD OF THE INVENTION

The present invention is related in general to the field of semiconductor devices and processes, and more specifically to the structure and method of ball grid array substrates fabricated by the additive methodology of differential plating.

DESCRIPTION OF RELATED ART

When the semiconductor chips for the popular ball-grid-array (BGA) packages are assembled on the substrates with the flip-chip technique, the chips have metal bumps for attachment onto substrate metal pads. Conventionally, bumps made of reflowing metals such as solder alloys have been used. The solder attachment process, especially with a chemical flux, is quite forgiving in terms of planarity and metallurgy of the substrate pads, since the surface tension of molten solder provides a self-aligning force during the assembly.

Recently, the continuing push towards smaller bumps with denser pitch center-to-center is driving a transition from solder bumps to bumps made of non-reflowing metals such as gold or copper. Unfortunately, the assembly with non-reflowing bumps is not forgiving, since a self-correcting and self-aligning force is absent. On the contrary, gold or copper bumps need planar substrate pads and also a pad area large enough to tolerate some misalignment, and further a pad surface with metallurgical affinity to gold or copper.

Especially the first two requirements of sufficiently large and planar pad area are increasingly more in conflict with the trend for miniaturization and scaling. This conflict arises from the method employed today in substrate preparation. The fabrication of the BGA substrates starts with an insulating carrier. After through-holes have been formed through the carrier, a thick metal foil (between about 15 and 20 µm) is laminated on the carrier. While the foil is protected, a plating technique is used to deposit metal in the through-holes in order to fill them, at least partially, with metal.

In the subsequent photolithographic technique, a photoresist layer is deposited on the metal layer on the substrate surface; the photoresist is patterned into lands and traces. During the subsequent metal etching step to form the lands over the metal-filled though-holes and the interconnecting traces, the etching medium (commonly a chemical etchant) causes undercutting of the metal under the photoresist layer; since the etching of metal is approximately isotropic, the undercutting creates a slope of about 45°. Consequently, after the foil is etched, the undercutting has progressed about as much as the thickness of the foil (between about 15 to 20 µm). The thicker the copper foil is and thus the longer the etching time has to last, the more detrimental the undercutting will be. Consequently, after stripping the photoresist layer, the resulting lands and traces do not exhibit the intended rectangular cross section, but rather a pronounced trapezoidal cross section with the narrow side upwards.

The gold stud to be attached to the copper trace is created by the ball bonding technique. A free air ball is formed by melting a piece of gold wire at the tip of the capillary. The wire has about 12 to 25 µm diameter, and the ball is about 1.3 times the diameter of the wire. The ball is squashed in the attachment process onto the chip terminal; the stud sticking out from the terminal is then determined by the truncated cone on the ball (shaped by the orifice of the capillary) and the flattening step after wire brake-off. Typically, the stud diameter is about half the ball diameter, approximately between 10 to 18 µm. For acceptable process yield, the placement of the ball requires a flat trace area of about 1.5 to 1.8 times the stud diameter, about 15 to 32 µm. Using a starting copper foil of 18 µm thickness, the etch undercut requires a starting trace width of about 50 µm—unacceptably wide for the fine pitch required in advanced devices of about 40 µm.

On the other hand, if a relatively thin copper foil is chosen for the lamination in order to keep the undercut small in the trace formation, the traces after etching exhibit an electrical resistance too high for many device applications; further, the thinner traces have been found to fatigue too quickly, causing poor reliability performance of the devices.

In the chip assembly process, when the bumps are to be attached to the trapezoidal traces, devices with narrow traces and tight trace pitch turn out to offer insufficient process tolerance. Any further trace miniaturization and scaling become more difficult.

SUMMARY OF THE INVENTION

In today's methodology, subtractive processes such as etching are used to create ever finer metallic trace patterns on BGA substrates. The subtractive methodology runs into severe problems of controlling the miniaturized traces for attachment area, parallelism, aspect ratios, electrical resistance and fatigue performance, thus rendering the attachment of bumped chips difficult. Applicants discovered that these shortcomings can be solved by using the opposite methodology of additive processes such as plating to create the traces. Further, the conflicting requirements of concurrently plating thin traces on the substrates and thick fillings in the through-holes can be resolved by employing differential plating.

Starting from a thin metal foil (few µm thick), the additive methodology electroplates traces of rectangular cross section and any width, height, and pitch, scaleable in unison with the chip traces. Traces with favorable aspect ratio offer low electrical resistance and trace fatigue, and chip bumps can be attached with acceptable process tolerance.

One embodiment of the invention is a ball grid array (BGA) device with the semiconductor chip and its metal studs (for instance gold) flipped onto the insulating substrate. The substrate has a through-holes filled with metal (for instance copper) up to a first thickness, and metal traces (for example copper) of a second thickness smaller than the first thickness and with sidewalls at right angles to the trace top surface. The traces further have the top surface covered by a solder layer, but the sidewalls are un-covered by the solder layer. Portions of the solder-layered traces are covered by an insulating soldermask, while the chip studs are attached to the solder of the un-covered trace portions. The traces with their rectangular cross section allow a width of 25 µm or less, while the pitch center-to-center may be between 40 and 60 µm.

Another embodiment of the invention is another BGA device with the semiconductor chip and its metal studs (for instance gold) flipped onto the insulating substrate. The substrate has through-holes filled with metal (for instance copper) up to a first thickness, and metal traces (for example copper) of a second thickness smaller than the first thickness and with sidewalls at right angles to the trace surface. A first portion of the traces is covered by an insulating soldermask, while the second portions of each trace, surface as well as sidewalls, are covered by a layer of solder. The chip studs are attached to the solder on the second trace portions. The traces with their rectangular cross section have a width of 25 µm or less, suitable for studs of 10 to 18 µm diameter.

Another embodiment of the invention is a method for fabricating a BGA device with the chip flipped onto a substrate. A polyimide tape (about 50 µm thick) receives an adhesive film, and holes are punched through film and tape. A metal foil 3 µm thin (for instance, copper) is then laminated on the adhesive film and bridges the holes. A photoresist layer is applied to the foil to define pads aligned with the through-holes, and traces about 20 to 25 µm wide. After developing the photoresist, openings expose portions of the metal foil. A dual side differential plating step deposits about 40 µm metal (for example, copper) in the tape through-holes, thereby at least partially filling the through-holes, and about 12 to 15 µm metal in the photoresist openings, thereby creating metal pads and traces.

Then, about 3 to 6 µm solder is plated on the metal surfaces. When the photoresist is removed, the traces have metal sidewalls normal to the trace surface, and a flat surface about 20 to 25 µm wide. The metal foil portions not covered by the plated metal are etched. A semiconductor chip with contact studs (about 10 to 18 µm diameter) is attached on the traces, using the tolerant, wide assembly window, while remaining trace portions may be protected by an insulating soldermask.

Another embodiment of the invention is modified method for fabricating a BGA device with the chip flipped onto a substrate. The modified method uses again a photomask for about 20 to 25 µm wide traces, but differs from the method described above in the sequence of process steps after the step of differential copper plating. After the plating, the photoresist is removed, and the copper sidewalls of the pads and traces are exposed; the sidewalls are normal to the trace surface and the surface has a flat surface of 20 to 25 µm width. The copper foil portions not covered by the plated copper are etched. A solder mask protects portions of the traces not needed for chip attachment. Then, solder layers about 3 to 6 µm thick are plated on the surface and on the sidewalls of the traces unprotected by the soldermask and on the metal surface in the tape through-holes. The metal traces have thus three solder-plated surfaces. Finally, a semiconductor chip with its contact studs (of 10 to 18 µm diameter) is attached on the traces unprotected by the soldermask. Compared to the method described above, the additional amount of solder on the traces helps to create particularly robust solder joints.

It is a technical advantage of the additive plating process that the wide surface of the traces enables a chip attachment step with a generous process tolerance. In addition, trace width and trace pitch center-to-center are scalable with the chip contact studs.

In is another technical advantage to use the differential plating technique to create the traces and the through-hole fillings simultaneously yet with different thicknesses, which can be individually adjusted for the desired thickness ratios. Further, the aspect ratio of trace thickness versus trace width can be controlled to keep electrical resistance and trace fatigue low.

The technical advances represented by certain embodiments of the invention will become apparent from the following description of the preferred embodiments of the invention, when considered in conjunction with the accompanying drawings and the novel features set forth in the appended claims.

BRIEF DESCRIPTION OF THE DRAWINGS

FIGS. 6 to 11 followed by FIGS. 12B, 13B, 14B, 15B, and 16B illustrate certain process steps of a substrate fabrication method according to another embodiment of the invention.

FIG. 6 is a schematic cross section of a portion of an adhesive substrate tape.

FIG. 7 shows a schematic cross section of the portion of the adhesive substrate tape in FIG. 6 illustrating the step of opening through-holes.

FIG. 8 shows a schematic cross section of the substrate portion of FIG. 7 illustrating the step of laminating a thin metallic foil.

FIG. 9 shows a schematic cross section of the substrate portion of FIG. 8 illustrating the step of applying a layer of photoresist.

FIG. 10 shows a schematic cross section of the substrate portion of FIG. 9 illustrating the steps of image exposure and photoresist development.

FIG. 11 shows a schematic cross section of the substrate portion of FIG. 10 illustrating the step of dual side differential metal plating according to the invention.

DETAILED DESCRIPTION OF THE PREFERRED EMBODIMENTS

Figure 1:
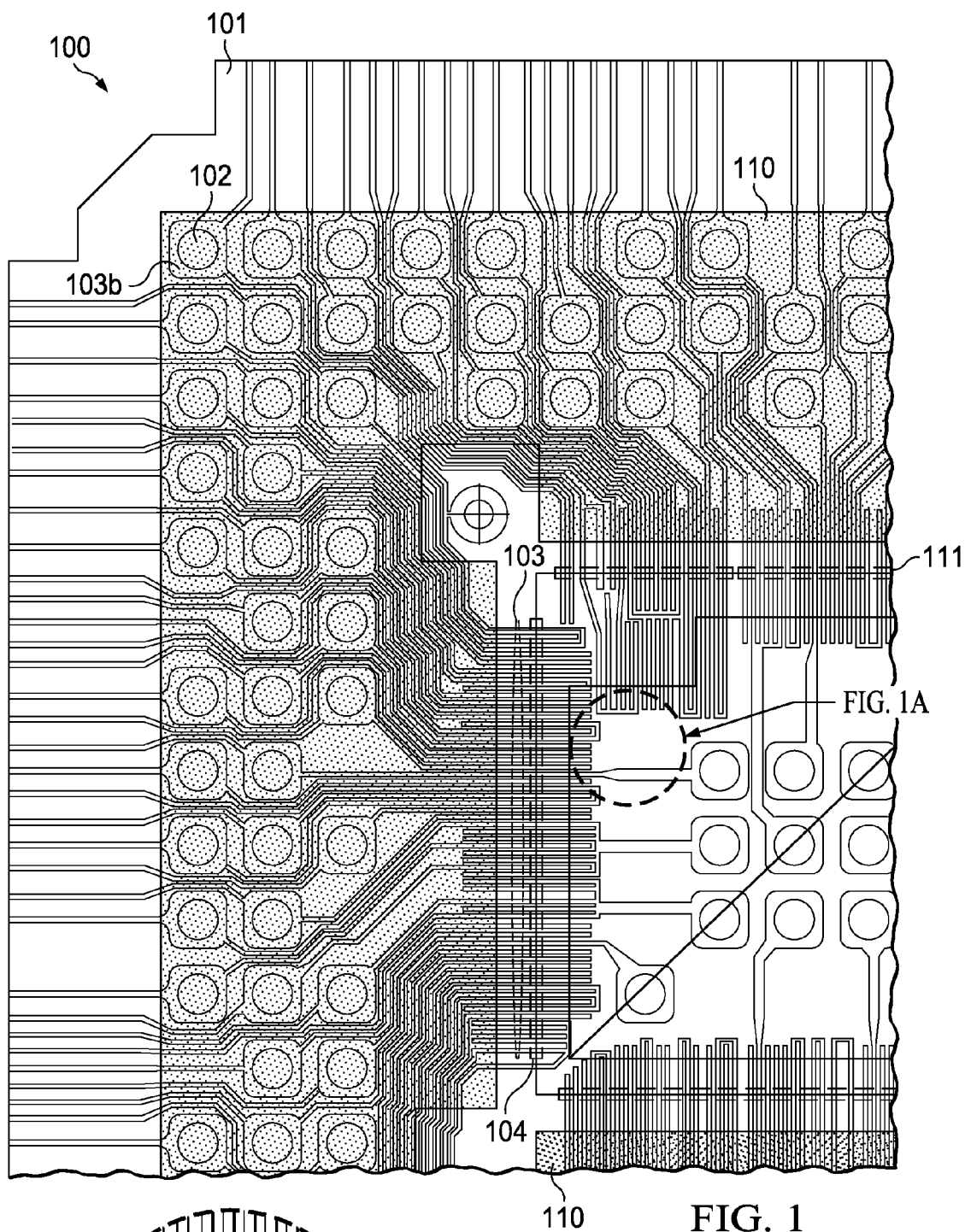
FIG. 1 is a top view of the substrate used for a ball grid array (BGA) device and intended for flip-chip assembly. The area shaded by a solder mask is shaded. Metallic traces and through-holes are indicated.
Figure 1A:
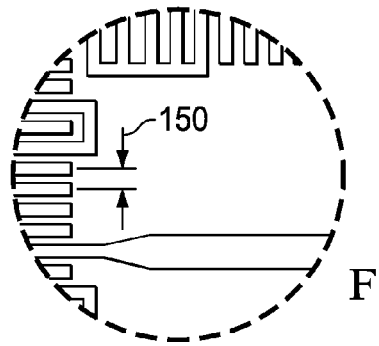

As an exemplary embodiment of the invention, FIG. 1 illustrates one quadrant of a substrate, generally designated 100, needed to build an advanced semiconductor device using a ball grid array (BGA) package and the flip-chip technology for assembling the chip on the substrate. The top view shows the insulating base 101 of the substrate, preferably a sheet of a polyimide compound in the thickness range from about 40 to 70 µm. FIG. 1 shows a plurality of through-holes 102 through the substrate. The diameter of a through-hole 102 is in the range from about 250 to 300 µm; the through-holes are filled with metal and extend from the first surface 101a to the second surface 101b of the substrate 101 (see FIG. 2).

FIG. 1 further depicts a great number of metallic traces 103, required to connect the conductive through-holes to the chip contact pads 104 on the traces. Preferably, the width of a trace 103, measured on the top surface of the trace, should be between about 20 and 25 µm in order to offer enough space to attach a contact metal stud of the chip (stud diameters are between about 10 to 18 µm, see below). In FIG. 1, the pitch 105 center-to-center of adjacent traces is between about 40 and 60 µm. A plurality of traces 103 widen to pads 103b over through-holes 102; pads 103b connect to the metal filling the through-holes.

Figure 3:
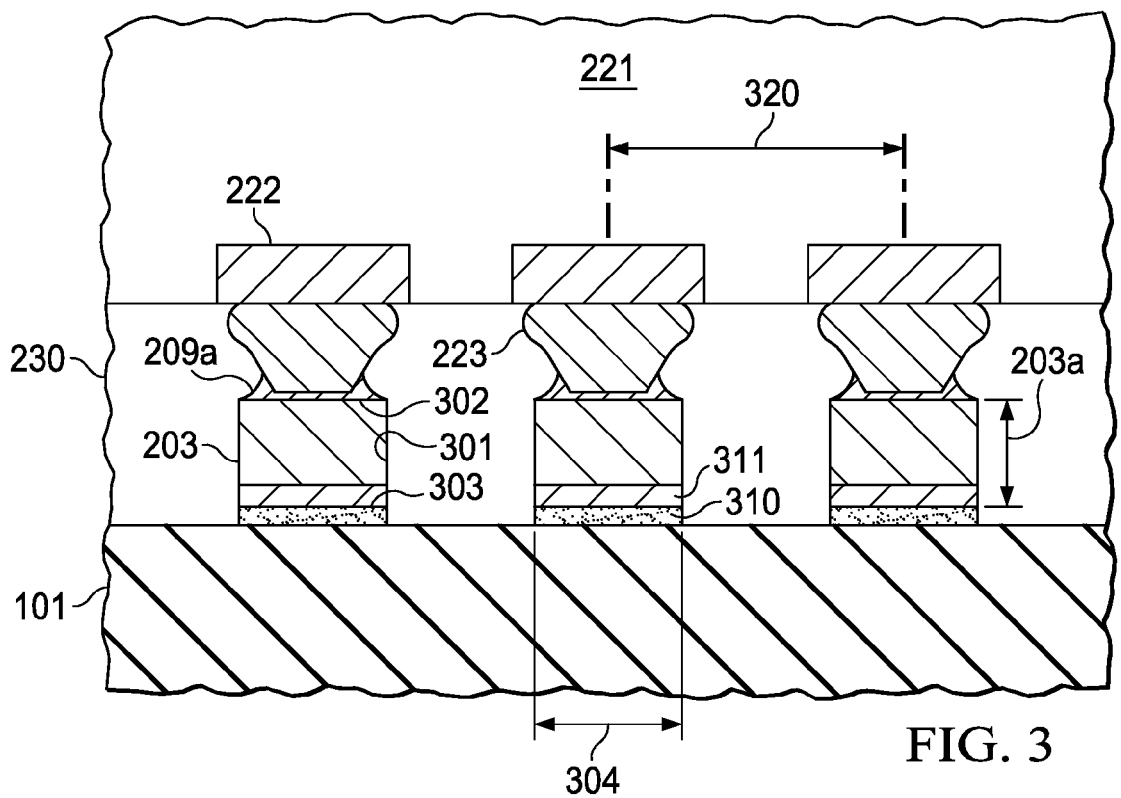
FIG. 3 illustrates another schematic cross section of a portion of a BGA package with chip contact studs solder-attached to metallic traces showing rectangular cross section, aspect ratios and bondable surfaces according to an embodiment of the invention.
Figure 5:
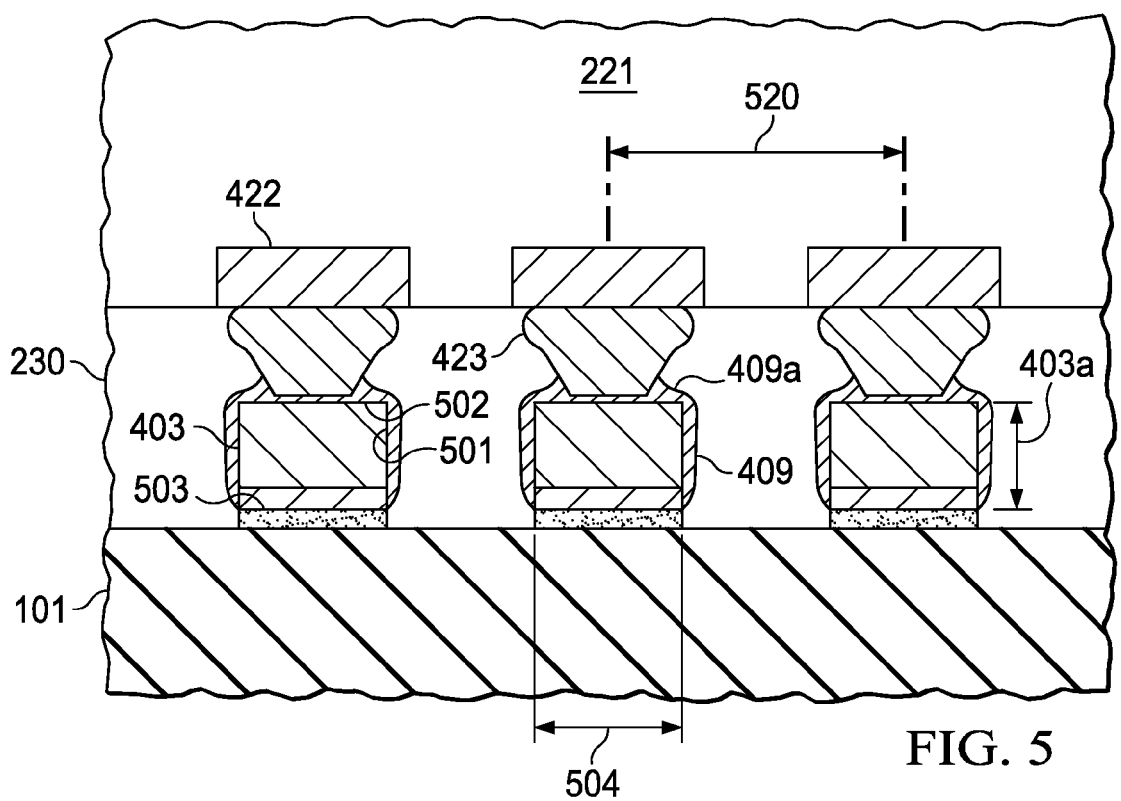
FIG. 5 illustrates another schematic cross section of a portion of a BGA package with chip contact studs solder-attached to metallic traces showing rectangular cross section, aspect ratios and bondable surfaces according to another embodiment of the invention.

The shaded area in FIG. 1 indicates the extent of the insulating solder resist layer 110, which protects a portion of the traces and the through-holes outside the assembled chip. The semiconductor chip, assembled on the substrate, is assumed transparent in FIG. 1; the metal contact studs of the chip are arrayed in lines 111 (more detail of the studs attached to the chip terminals is shown in FIGS. 3 and 5).

Figure 2:
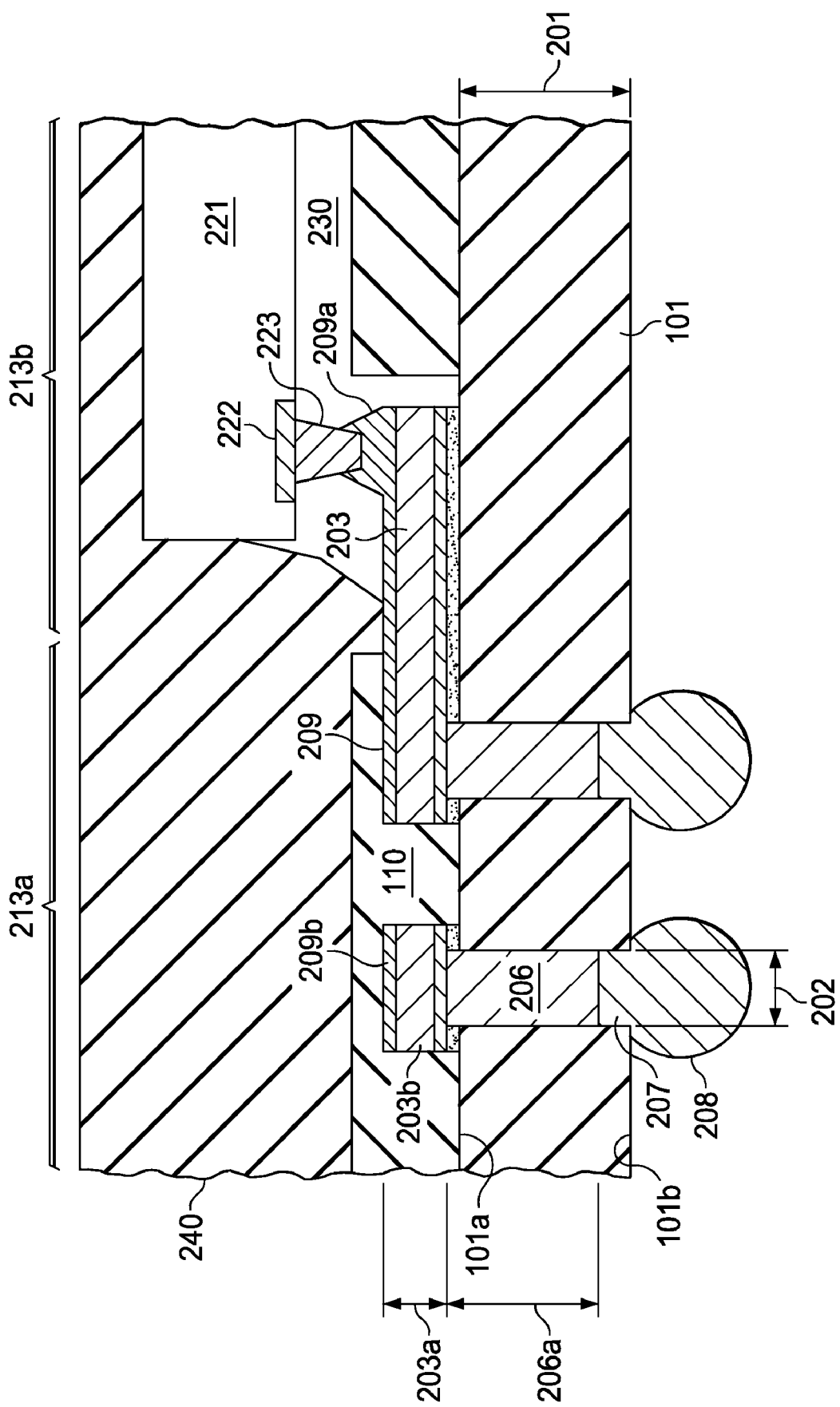
FIG. 2 shows a schematic cross section of a portion of a BGA package with metal-filled through-holes and solder bodies, a chip contact stud solder-attached to a metallic trace, and solder distribution according to an embodiment of the invention. Not to scale.
Figure 4:
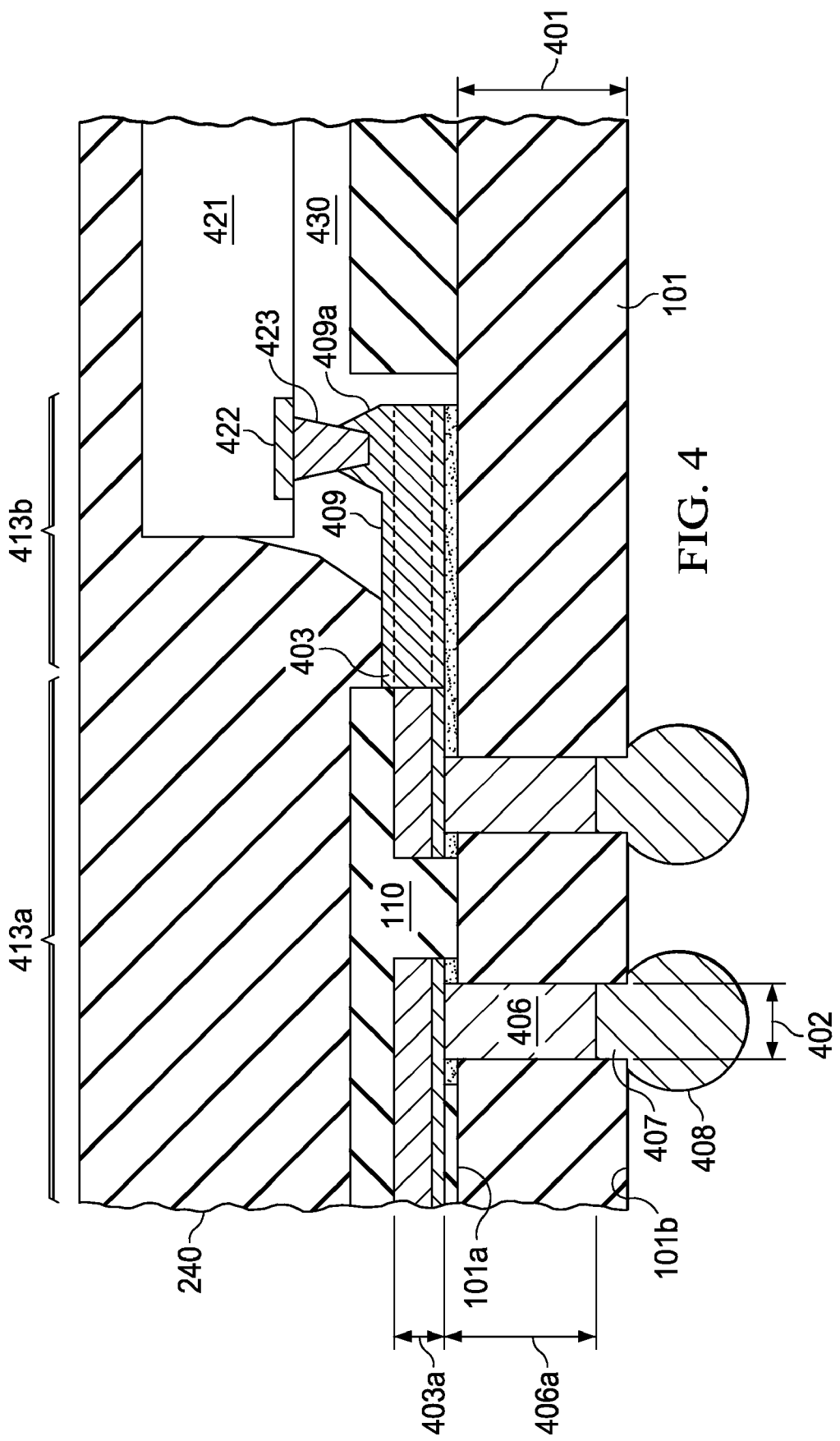
FIG. 4 shows a schematic cross section of a portion of a BGA package with metal-filled through-holes and solder bodies, a chip contact stud solder-attached to a metallic trace according to another embodiment of the invention. Not to scale.

FIGS. 2 and 4 illustrate cross sections of portions of BGA devices, which include embodiments of the invention; the cross sections are taken along a trace sidewall. In the embodiment shown in FIG. 2, chip 221 has a terminal 222, onto which a metallic stud 223 is affixed as a chip contact. Stud 223 is preferably made of gold; alternatively, stud 223 may be made of copper or a copper alloy. While stud 223 is schematically depicted as a truncated cone, its actual shape is often more complex (see FIG. 3).

FIG. 2 depicts a portion of the substrate, onto which chip 221 is assembled. The substrate includes the insulating base 101 with its thickness 201, first surface 101a and second surface 101b. Insulating base 101 is preferably a sheet of a polyimide compound with a thickness 201 ranging from about 40 to 60 µm. The through-holes with diameter 202 extend through the substrate base from the first surface 101a to the second surface 101b. As stated above, through-hole diameter 202 is preferably in the range from 250 to 300 µm. As FIG. 2 shows, the through-holes are filled with metal; actually, the filler includes metal 206, which partially fills the through-hole and is preferably made of copper, and solder alloy 207, which fills the remainder of the through-hole. The thickness 206a of metal 206, referred to as first thickness, is approximately 40 µm, smaller than thickness 201 (the fabrication of metal 206 is described below). Solder 207 originates partially from a plating process (see below) and partially from solder body 208, which is attached to the metal in the through-hole and serves the contact of the BGA device to external parts.

On the surface 101a of the substrate is a plurality of metallic traces 203. The traces are preferably made of copper, and have a second thickness 203a, which is smaller than the first thickness 206a. Preferably, second thickness 203a is between about 12 and 15 µm; it may be thinner in devices, where trace resistance and trace fatigue requirements permit. The origin of the difference between thickness 203a and thickness 206a is explained by the differential plating process described below. Traces 203 have a rectangular cross section discussed in FIG. 3, where the trace sidewalls are normal to the trace surface.

Traces 203 further have a layer 209 of solder covering their surface. The thickness of layer 209 is preferably between about 3 and 6 µm; in some devices the layer may be thicker. Solder from layer 209 is used to wet studs 223 in the assembly process of chip 221; the solder wicking up on stud 223 is designated 209a. As FIG. 2 indicates, the sidewalls of traces 203 are not covered by solder layer 209; rather, the sidewalls exhibit the metal of the traces (metal, for example copper).

FIG. 2 illustrates another portion of the traces, namely the pads 203b over the metal-filled through-holes. pads 203b are made of the same metal (preferably copper) as traces 203 and also have solder layer 209b covering the surface of pad 203b; the sidewalls of pads 203b are uncovered by solder.

As FIG. 2 depicts, first portions 213a of the solder-layered traces are covered by an insulating soldermask 110, while second portions 213b of the traces are left uncovered. It is on the second trace portions of selected traces that the studs 223 of chip 221 are attached for the assembly of the chip onto the substrate; FIG. 2 indicates the solder 209a from solder layer 209 used for the assembly.

Since the stud assembly creates a standoff gap between the assembled chip and the substrate, it is preferred to fill the gap with a polymer precursor 230, which is pulled into the gap by capillary forces. After polymerization, the precursor help mitigate thermo-mechanical stresses on the stud solder joints.

FIG. 2 further indicates that it is advantageous to encapsulate the device in a polymer compound 240, preferably an epoxy-based molding compound. After polymerization, the encapsulation not only protects the assembled chip and portions of the substrate with the traces, but also offers mechanical robustness to the device, especially when substrate 101 is a tape of only about 50 µm thickness. After encapsulation, the attachment of solder bodies 208 completes the BGA.

FIGS. 3 and 5 are exemplary cross sections of flip-chip device portions, which highlight features of the invention; the cross sections are taken along an array of solder joints. The illustrated features can be applied to any flip-chip device; they are especially useful for BGA devices. Equivalent device parts have been given the same designations as in FIG. 2. The cross section of FIG. 3 illustrates three adjacent terminals 222 of chip 221, which have studs 223 attached. Studs 223, preferably made of gold, may have a variety of shapes and fabrication history; the studs displayed in FIGS. 3 and 5 are fabricated in a modified ball bonding technique. A wire is strung through a capillary with an inverted cone-shaped orifice. At the tip of the wire protruding from the orifice, a free air ball is created using a flame or a spark technique. The ball has a typical diameter from about 1.2 to 1.6 wire diameters. The capillary is lowered onto terminal 222 and the ball, still hot and soft, is pressed against the metal of terminal 222 under a combination of compression force and ultrasonic energy. The squashed ball is topped by the truncated cone formed by the capillary orifice. The wire is then broken off in the heat-affected zone and flattened, whereby the stud is formed. In FIG. 3, a portion of stud 223 is immersed in solder 209a to attach to trace 203.

Traces 203 are metallic and are preferably made of copper. The traces have rectangular cross section, wherein the trace sidewalls 301 are substantially normal (at right angles) to the trace surface 302 and also substantially normal to the bottom 303. The height (thickness) of trace 203 is designated 203a and the width is designated 304, whereby the width is the same close to surface 302 and close to the bottom 303. Preferably, width 304 is between 20 and 25 μm. The ratio of width versus height determines the aspect ratio of the trace. It is a technical advantage of the invention that the additive fabrication process (metal plating, see below) of the traces allows a wide variation of the aspect ratio, while optimizing the width 304 for stud attachment purposes. It is another technical advantage that the pitch 320 center-to-center between adjacent traces can be selected in conjunction with the aspect ratio. For traces at close proximity, as shown in FIG. 1 as pitch 105, the pitch is about 40 to 60 μm. FIG. 3 indicates that the trace sidewalls 301 are free of solder and show the metallic surface of the trace.

Another embodiment is illustrated in FIG. 4 by the cross section taken along a trace sidewall of a BGA portion. Chip 421 has a terminal 422, onto which a metallic stud 423 is affixed as a chip contact. Stud 423 is preferably made of gold. The substrate, onto which chip 421 is assembled, includes the insulating base 101 with its thickness 401, first surface 101a and second surface 101b. Insulating base 101 is preferably a sheet of a polyimide compound with a thickness 401 ranging from about 40 to 60 μm. The through-holes with diameter 402 extend through the substrate base from the first surface 101a to the second surface 101b. As FIG. 4 shows, the through-holes are filled with metal; actually, the filler includes metal 406, which partially fills the through-hole and is preferably made of copper, and solder alloy 407, which fills the remainder of the through-hole. The thickness 406a of metal 406, referred to as first thickness, is approximately 40 μm, smaller than the thickness 401 (the fabrication of metal 406 is described below). Solder 407 originates partially from a plating process (see below) and partially from solder body 408, which is attached to the metal in the through-hole and serves the contact of the BGA device to external parts.

On the surface 101a of the substrate is a plurality of traces 403. The traces are preferably made of copper, and have a second thickness 403a, which is smaller than the first thickness 406a. Preferably, second thickness 403a is between about 12 and 15 μm; it may be thinner in devices, where trace resistance and trace fatigue requirements permit. The origin of the difference between thickness 403a and thickness 406a is explained by the differential plating process described below. Traces 403 have a rectangular cross section discussed in FIG. 5, where the trace sidewalls are normal to the trace surface.

As FIG. 4 depicts, first portions 413a of the traces are covered by an insulating soldermask 110, while second portions 413b of the traces are left uncovered. Second trace portions 413b have all surfaces (top and sidewalls) covered by a layer 409 of solder. The thickness of layer 409 is preferably between about 3 and 6 μm; in some devices the solder layer may be thicker. It is on the second trace portions of selected traces that the studs 423 of chip 421 are attached for the assembly of the chip onto the substrate; FIG. 4 indicates the solder 409a, which is wicking up on stud 423 from solder layer 409.

While trace portions 413b have the surfaces covered by a solder layer, the trace portions 413a, covered under the soldermask 110, are not covered by a solder layer. Trace portions rather exhibit the metal of the traces (for example copper).

FIG. 5 illustrates three adjacent terminals 422 of chip 221, which have studs 423 attached. Studs 423, preferably made of gold, may have a variety of shapes. Traces 403 are preferably made of copper and have rectangular cross section, wherein the trace sidewalls 501 are substantially normal (at right angles) to the trace surface 502 and also substantially normal to the bottom 503. The height (thickness) of trace 403 is designated 403a and the width is designated 504, whereby the width is the same close to surface 502 and close to the bottom 503. The ratio of width versus height determines the aspect ratio of the trace. It is a technical advantage of the invention that the additive fabrication process (metal plating, see below) of the traces allows a wide variation of the aspect ratio, while optimizing the width 504 for stud attachment purposes. It is another technical advantage that the pitch 520 center-to-center between adjacent traces can be selected in conjunction with the aspect ratio.

FIG. 5 indicates that all trace sidewalls 501 are covered by a solder layer 409. A portion 409a of the solder is used for attaching stud 423 to trace 403.

Another embodiment of the invention are methods for fabricating a semiconductor device based on flip-chip assembly. The methods use additive processes such as electroplating to create substrate traces with rectangular cross sections and controlled aspect ratios of height versus width, thus maximizing the area available for attaching the chip bumps, while simultaneously minimizing the trace pitch center-to-center. The methods further use differential additive processes such as differential plating to independently optimize the thicknesses for the metal traces and the metal in the through-holes. The methods share several process steps during the early part of the process flow (FIGS. 6 to 11), and then continue along different process routes to the finish (FIGS. 12A, 13A, 14A, 15A, and 16A; FIGS. 12B, 13B, 14B, 15B, and 16B).

Figure 6:
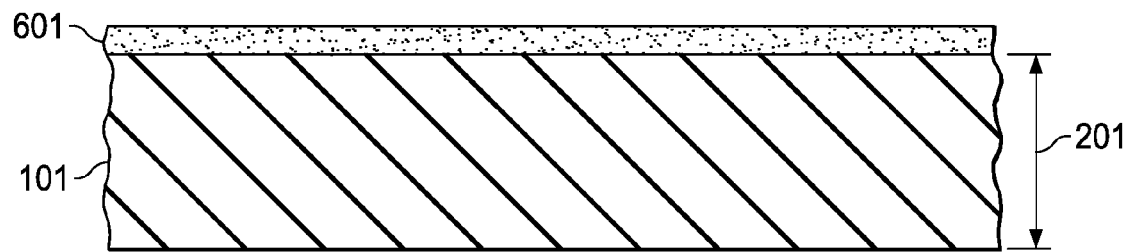
FIGS. 6 to 11 followed by FIGS. 12A, 13A, 14A, 15A, and 16A illustrate certain process steps of a substrate fabrication method according to an embodiment of the invention.
Figure 7:
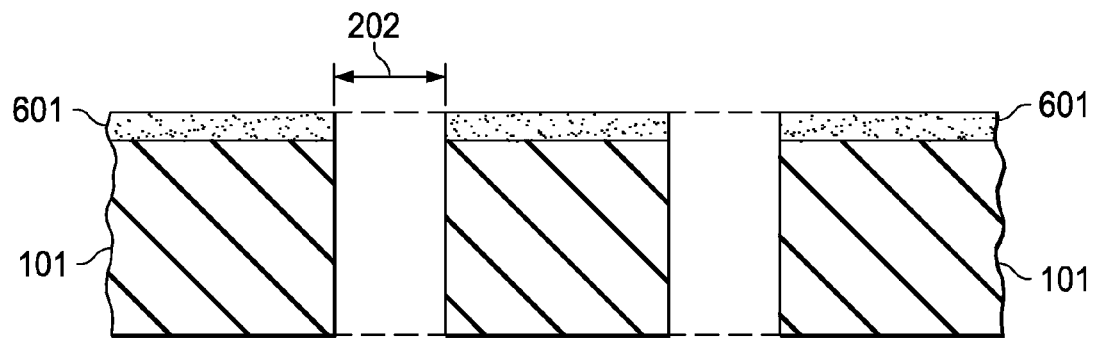
Figure 8:
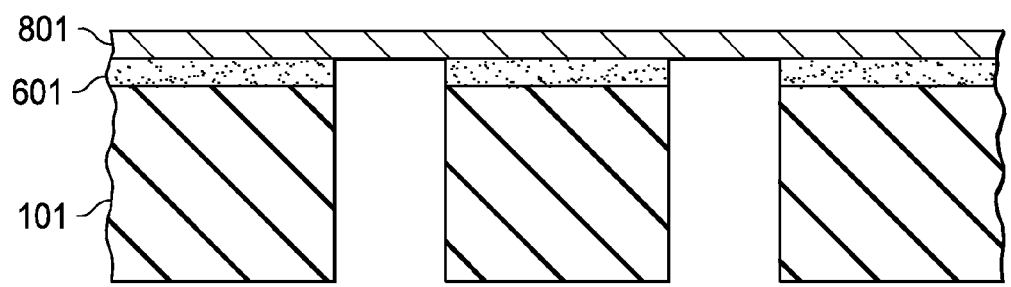

The methods start in FIG. 6 by applying an adhesive film 601 on one surface of a plastic tape 101; the tape is made for instance of a polyimide compound with a thickness 201 of about 50 μm. Next, as shown in FIG. 7, through-holes of diameter 202 are opened through the tape and the adhesive film, for example by punching. For many devices, the preferred through-hole diameter is between about 250 and 300 μm. In the next process step, illustrated in FIG. 8, a metal foil 801 is laminated on the adhesive 601 to bridge over the through-holes. The foil operates to distribute a uniform electrical potential across the tape in the subsequent electroplating process. Preferably, foil 801 is made of copper and about 3 μm thick. Alternatively, it can be made of aluminum.

Figure 9:
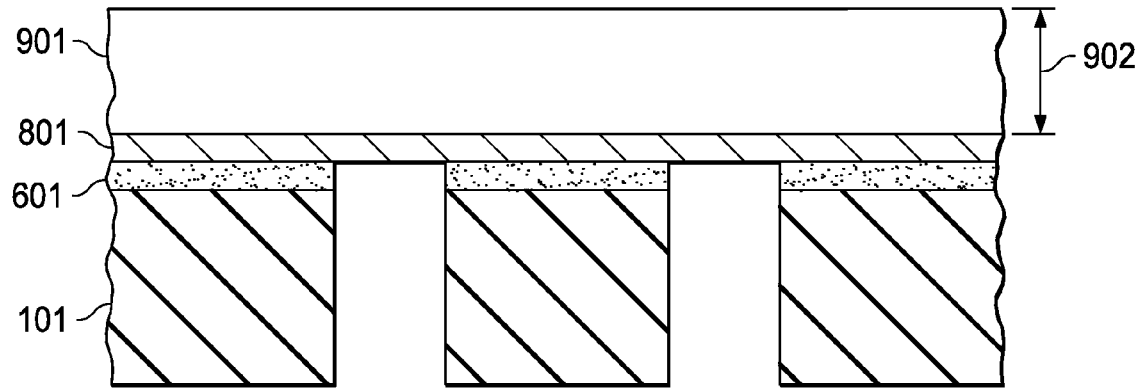
Figure 10:
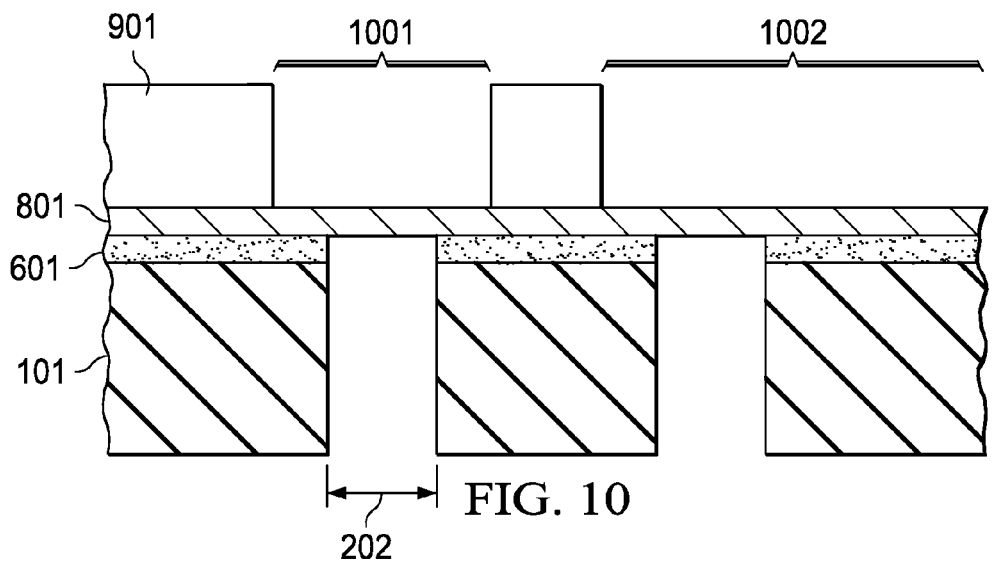

FIG. 9 depicts the step of applying a photoresist layer 901 over the metal foil 801. The photoresist layer may be a dry film or may be printed. It has a thickness 902 preferably in the range from 15 to 20 μm. FIG. 10 indicates the photolithographic process step. In this example, a negative image exposure and resist development is assumed in order to create openings in the photoresist and expose portions of the metal foil 801. On opening in FIG. 10, designated 1001, is intended to serve the formation of a pad; consequently, opening 1001 is aligned center-to-center with through-hole 202. The other opening, designated 1002, is intended to serve the formation of a trace.

Figure 11:
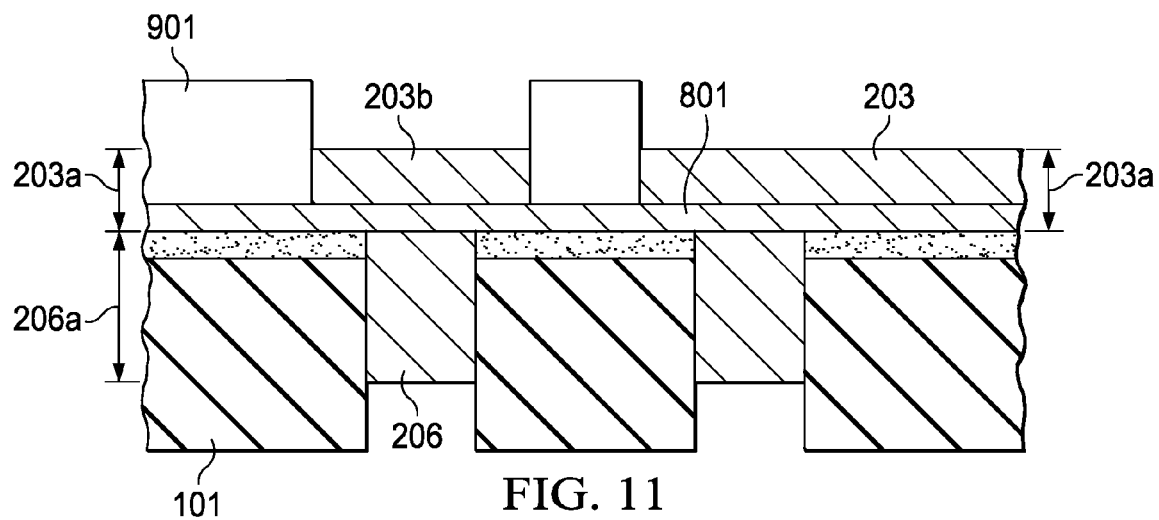

The next process step, illustrated in FIG. 11, produces the dual side differential plating of the exposed portions of foil 801. The preferred method for the plating step is a reel-to-reel plating line, wherein the plastic tape, laminated with the metal foil, runs from the starting reel through a cleaning tank, an activation tank, the electrolytic metal plating tank, and a drying tank to the collecting reel. Since the plating process is intended to deposit a thicker metal layer in the through-holes and a thinner metal layer in the photoresist openings, a differential plating processes is employed, which uses one of several modifications of the plating tank.

The amount of deposited metal is proportional to the amount of used electricity (i.e., electrical current times consumed time; First FARADAY's Law). In one modification, the fabrication tank has two plating cells. The metal foil, biased as cathode, runs along the center line of the first cell at equal distance from the anode baskets on both sides and thus receives an equal amount of plated metal in the photoresist openings and in the tape through-holes. Running through the second cell, one anode basket is replaced by a solid plastic positioned at close distance to the tape side with the photoresist openings (dielectric shielding), so that only minimal further metal is deposited in the openings. During the same time span, the metal deposition in the tape through-holes continues undiminished.

In another modification, the tape runs through a tank with a single cell but at unequal distances from the anode baskets. More metal is deposited on the tape side with the shorter distance to the anode cell.

In another modification, the tape, as cathode, runs through a tank with a single cell equidistant from the anode baskets but with an additional electrode in front of the tape side with the photoresist layer. The additional electrode (mesh, screen, etc.) is biased so that it reduces the flow of electric current reaching the metal foil portions exposed in the photoresist openings. Consequently, less metal is plated in the openings compared to the other tape side with the through-holes, which faces the full-strength anode basket.

Another modification employs two plating tanks, wherein one tank can plate more metal than the other tank. Before immersing the tape into the respective tank, the tape side not to be plated needs to be shielded (protected) by a cover, such a peel-off foil.

After the plating step, the plated metal thickness $203b$ in the photoresist openings (about 12 µm) is smaller than the plated metal thickness $206a$ in the through-holes (about 40µ). With the added thickness of the metal foil 801 (about 3 µm), the traces 203 and the pads $203b$ have the thickness $203a$ (about 15 µm). In contrast, the plated metal in the through-holes 206 has the thicker thickness $206a$ (about 40 µm). By the plating step, the metal pads and traces are created.

The metal plating step completes the joint part of the process flow. Thereafter, in one embodiment, the process flow continues along steps illustrated in FIGS. 12A to 16A; in another embodiment, the process flow continues along steps illustrated in FIGS. 12B to 16B.

Figure 12A:
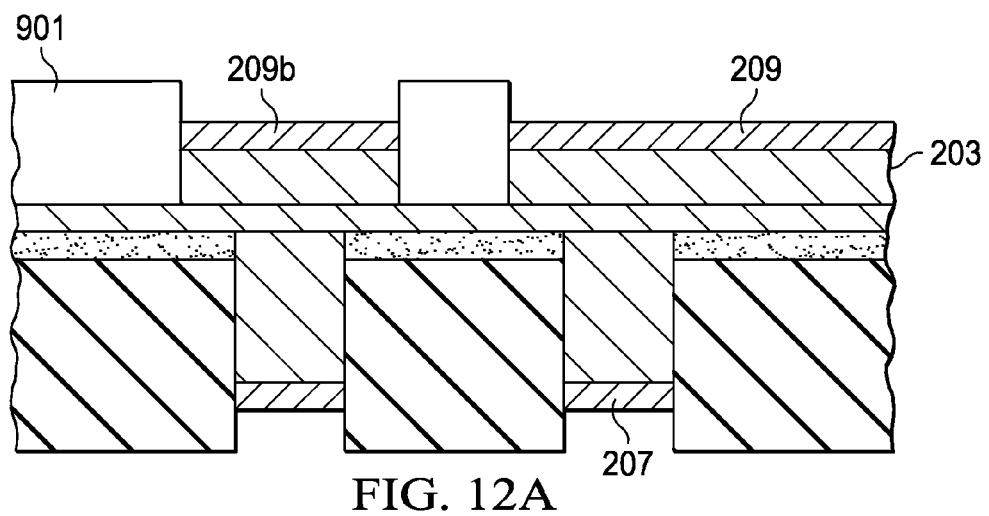
FIG. 12A shows a schematic cross section of the substrate portion of FIG. 11 illustrating the step of dual side solder plating.
Figure 12B:
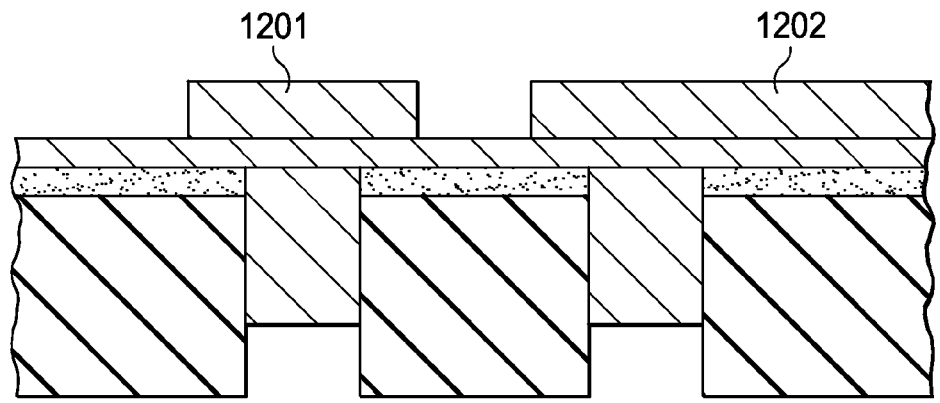
FIG. 12B shows a schematic cross section of the substrate portion of FIG. 11 illustrating the step of stripping the photoresist.

While the photoresist layer 901 is still in place, the process step shown in FIG. 12A plates a layer 209 of solder in a solder plating tank. The solder layer is on all exposed surfaces of the traces (209), the pads ($209b$) and the metal fillings the through-holes (207). The solder layer is, for example, between 3 and 6 µm thick; however, it can be plated thicker if desirable for chip attachment reasons.

Figure 13A:
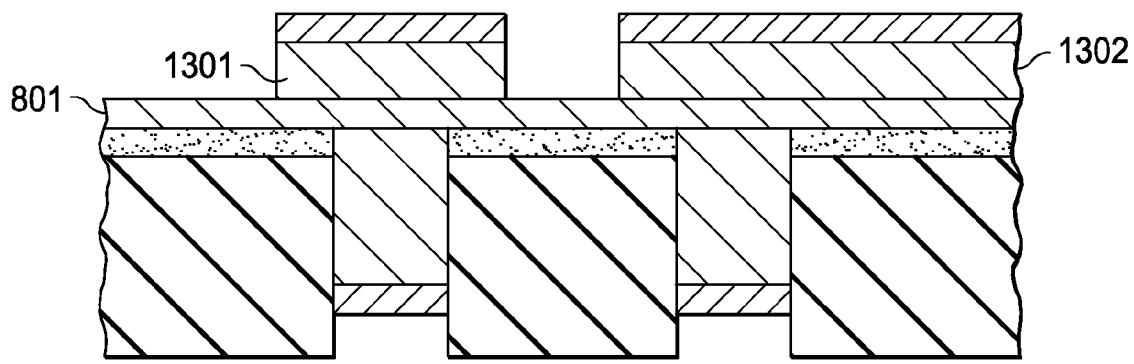
FIG. 13A shows a schematic cross section of the substrate portion of FIG. 12A illustrating the step of stripping the photoresist.
Figure 13B:
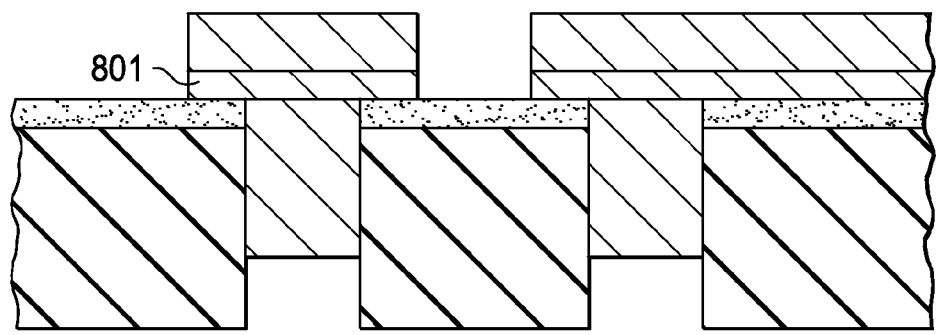
FIG. 13B shows a schematic cross section of the substrate portion of FIG. 12B illustrating the step of etching the thin metallic foil.

In the step illustrated in FIG. 13A, the photoresist layer is removed, exposing the metal side walls of the plated pads (1301) and traces (1302). In the step shown in FIG. 14A, the portions of the metal foil 801, which are not covered by a plated metal, are removed, preferably by a flash etching technique. The metal traces and pads of the substrate tape are now fully patterned on the tape surface $101a$; an example of such patterned substrate metal is shown in FIG. 1.

Figure 15A:
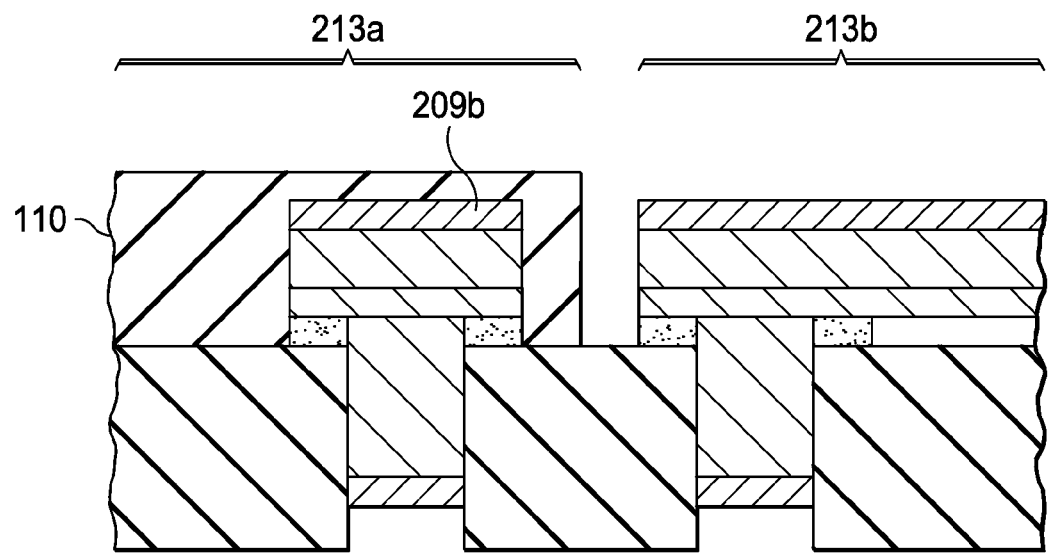
FIG. 15A shows a schematic cross section of the substrate portion of FIG. 14A illustrating the step of applying and defining a soldermask.

In the process step summarized in FIG. 15A, a layer of insulating soldermask 110 is deposited, exposed and developed on a first portion $213a$ of the tape to protect the pads and a first portion of the traces. The second portion $213b$ of the traces remains uncovered and thus available for attaching the contact studs of the chip to selected traces. As a consequence of the sequence of plating steps, even the soldermask-covered pads and traces have a surface layer $209b$ of solder.

Figure 16A:
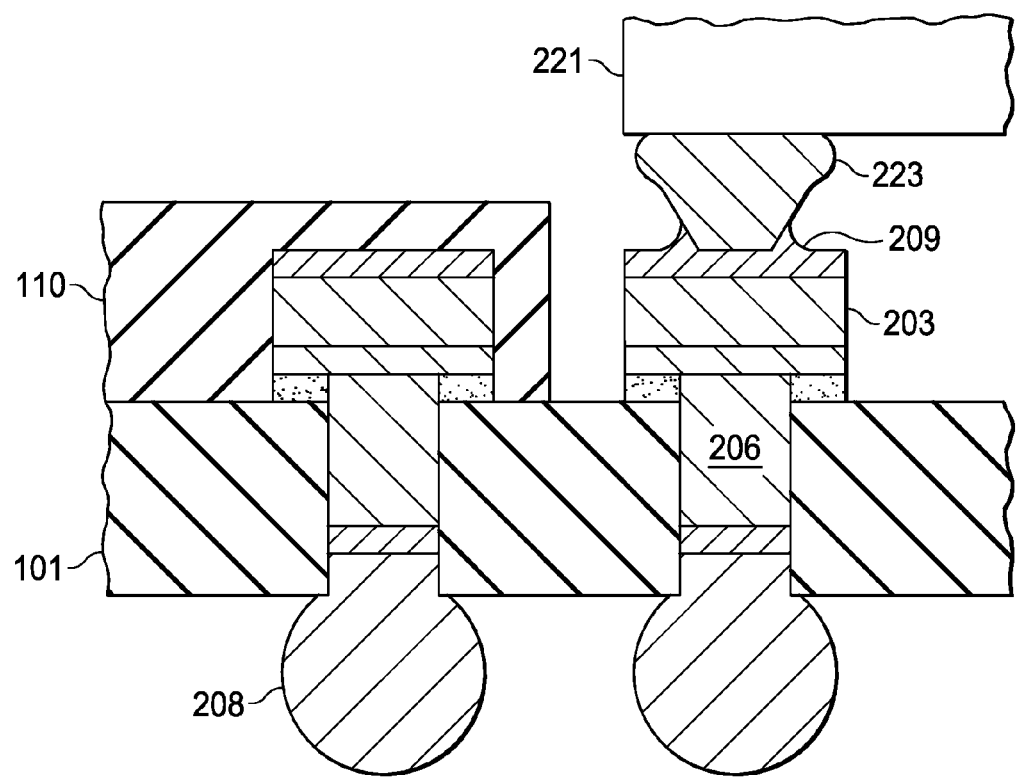
FIG. 16A illustrates a schematic cross section of a portion of a BGA package with a chip contact stud solder-attached to a metallic trace showing rectangular cross section and bondable surfaces according to a process flow of the invention.

FIG. 16A depicts the completion of the BGA device (not to scale). Using the designation numbers of the related FIG. 2, FIG. 16A shows a semiconductor chip 221 with contact studs 223 attached onto the traces 203 on insulating tape 101. The traces, which are unprotected by soldermask 110, have solder on the top surface, but not on the sidewalls. The sidewalls of the traces are at right angles to the trace top, giving the trace a rectangular cross section. Consequently, the area for attaching stud 223 is maximized. At the same time, the differential plating method of trace metal 203 and through-hole metal 206 allows different metal thicknesses and provides independent control of the trace aspect ratio for low electrical resistance and trace fatigue.

In contrast, the process flow illustrated by FIGS. 12B to 15B starts by removing the photoresist layer 901 right after the metal plating step of FIG. 11. Consequently, in FIG. 12B, the metal sidewalls of the pads (1201) and traces (1202) are exposed; they show the plated metal, for example copper. Next, in the step depicted in FIG. 13B, the portions of the metal foil 801, which are not covered by a plated metal, are removed, preferably by a flash etching technique.

Figure 14A:
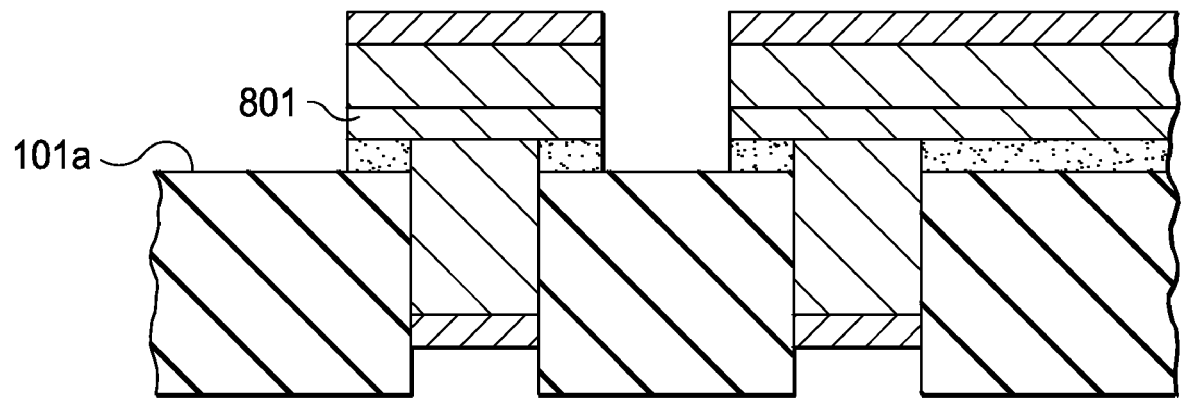
FIG. 14A shows a schematic cross section of the substrate portion of FIG. 13A illustrating the step of etching the thin metallic foil.
Figure 14B:
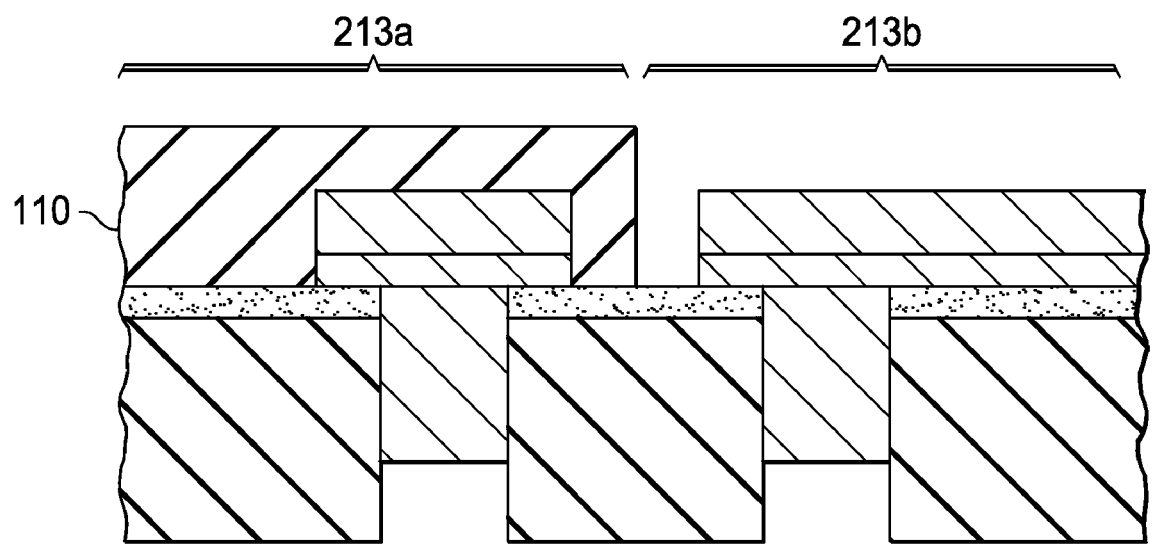
FIG. 14B shows a schematic cross section of the substrate portion of FIG. 13B illustrating the step of applying and defining a soldermask.

In the process step summarized in FIG. 14B, a layer of insulating soldermask 110 is deposited, exposed and developed on a first portion $213a$ of the tape to protect the pads and a first portion of the traces. The second portion $213b$ of the traces remains uncovered and thus available for additional plating.

Figure 15B:
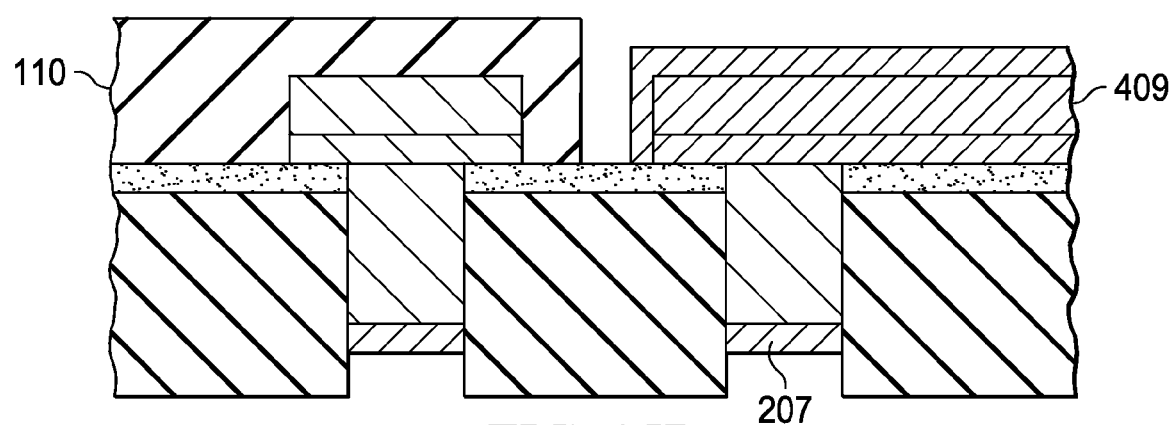
FIG. 15B shows a schematic cross section of the substrate portion of FIG. 14B illustrating the step of dual side solder plating.

The tape with the partially soldermask-covered portion is put into a tank for electroplating solder. FIG. 15B shows the result after plating. A layer 409 of solder is deposited (preferably about 3 to 6 µm thick) on the surface as well as on the sidewalls of the traces unprotected by the soldermask; in addition, a solder layer 207 is deposited on the surfaces of the metal in the through-holes.

Figure 16B:
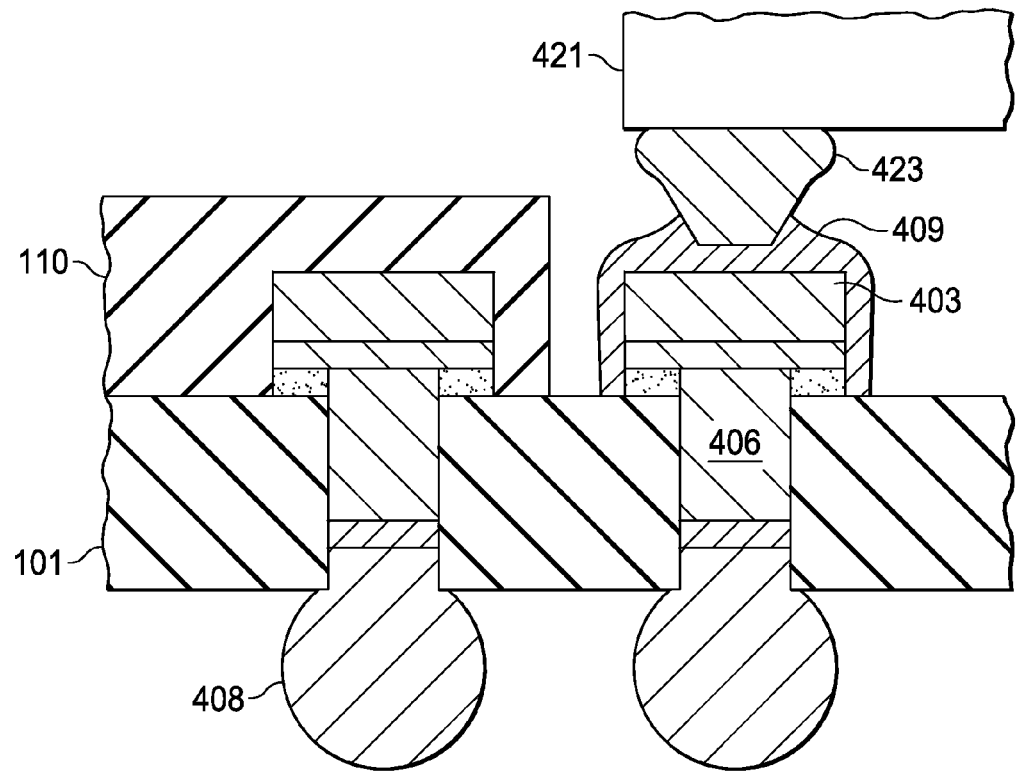
FIG. 16B illustrates a schematic cross section of a portion of a BGA package with a chip contact stud solder-attached to a metallic trace showing rectangular cross section and bondable surfaces according to another process flow of the invention.

FIG. 16B depicts the completion of the BGA device (not to scale). Using the designation numbers of the related FIG. 4, FIG. 16B shows a semiconductor chip 421 with contact studs 423 attached onto the traces 403 on insulating tape 101. The traces, which are unprotected by soldermask 110, have solder on the top surface as well as on the sidewalls. The sidewalls of the traces are at right angles to the trace top, giving the trace a rectangular cross section. Consequently, the area for attaching stud 423 is maximized. At the same time, the differential plating method of trace metal 403 and through-hole metal 406 allows different metal thicknesses and provides independent control of the trace aspect ratio for low electrical resistance and trace fatigue.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the invention applies to any type of semiconductor chip, discrete or integrated circuit, in a flip-chip BGA-type package. The material of the semiconductor chip may comprise silicon, silicon germanium, gallium arsenide, or any other semiconductor or compound material used in integrated circuit manufacturing.

As another example, the invention applies to discrete BGA substrates and also to substrates, which are fabricated on a reel-to-reel basis. In the latter application, the concepts of differential plating and plating in different metal tanks can be used with great economic advantage.

As another example, the invention applies to BGA devices with substrates having more than one metal layer and thus more than one level of traces.

It is therefore intended that the appended claims encompass any such modifications or embodiment.

We claim:

1. A semiconductor device comprising:
a semiconductor chip having terminals with contact studs;
an insulating substrate, onto which the chip is assembled, the substrate having through-holes filled with metal up to a first thickness;
metal traces on the substrate, the traces having a second thickness smaller than the first thickness and a rectangular cross section, wherein the trace sidewalls are normal to the trace surface;
the traces further having a layer of solder covering the surface, wherein the sidewalls are un-covered by the solder layer;
first portions of the solder-layered traces covered by an insulating soldermask, leaving the second portions uncovered; and
the studs attached to the solder layer on the second trace portions of selected traces.

2. The device of claim 1 wherein the contact studs are selected from a group including gold and copper.

3. The device of claim 1 wherein the metal is selected from a group including copper and aluminum.

4. The device of claim 1 wherein the substrate is a tape of a polyimide compound having a thickness ranging from about 40 to 60 µm.

5. The device of claim 1 wherein the first thickness is approximately 30 to 40 µm.

6. The device of claim 1 wherein the solder layer has a thickness between about 3 and 6 µm.

7. The device of claim 1 wherein the second thickness is between about 12 and 15 µm.

8. The device of claim 1 further including a stand-off gap between the assembled chip and the substrate.

9. The device of claim 8 further including a polymerized precursor compound filling the standoff gap between the assembled chip and the substrate.

10. The device of claim 1 further including a protective polymerized compound encapsulating the assembled chip and a portion of the substrate with the traces.

11. A semiconductor device comprising:
a semiconductor chip having terminals contact studs;
an insulating substrate, onto which the chip is assembled, the substrate having through-holes filled with metal up to a first thickness;
metal traces on the substrate, the traces having a second thickness smaller than the first thickness and a rectangular cross section, wherein the trace sidewalls are normal to the trace surface, each trace including a first and a second portion;
the first portions of the traces covered by an insulating soldermask;
the second portions of each trace, surface and sidewalls, covered by a layer of solder; and
the studs attached to the solder layer on the second trace portions of selected traces.

12. A method for fabricating a semiconductor device comprising the steps of:

attaching an adhesive film on a substrate tape;
opening through-holes through the film and the tape;
placing a metal foil on the adhesive film across the tape, thereby bridging the through-holes;
depositing a layer of photoresist on the metal foil;
positioning a photomask on the photoresist to define pads aligned with the through-holes center-to-center, and traces for interconnections;
exposing and developing the photoresist to create openings exposing portions of the metal foil;
positioning the substrate in an electrolytic metal plating tank so that the metal deposition rate on the foil portions exposed in the tape through-holes will be greater than the deposition rate on the foil portions exposed in the photoresist openings;
electroplating metal layers on the exposed foil portions, until the metal layers in the tape through-holes reach a first thickness, and the metal layers in the photoresist openings reach a second thickness smaller than the first thickness, thereby creating metal pads and traces, respectively;
then electroplating a layer of solder on the surface of the metal layers in the tape through-holes and in the photoresist openings;
removing the photoresist, thereby exposing the metal sidewalls of the plated pads and traces;
removing the portions of the metal foil not covered by the deposited metal;
depositing, exposing and developing a layer of soldermask on a portion of the tape to protect the pads and the traces of the portion; and
attaching a semiconductor chip having contact studs onto the traces unprotected by the soldermask.

13. The method of claim 12 wherein the metal is copper.

14. The method of claim 12 wherein the metal layer plated on the pads and traces has sidewalls substantially normal to the surface of the plated layer.

15. The method of claim 12 wherein the metal sidewalls of the pads and traces are free of solder.

16. The method of claim 12, wherein the step of attaching the contact studs of the chip forms a standoff gap between the assembled chip and the substrate tape.

17. The method of claim 16 further including, after the step of assembling the chip, the steps of filling the standoff gap with a polymer precursor and polymerizing the precursor.

18. The method of claim 17 further including, after the step of filling the gap, the steps of encapsulating the assembled chip and portions of the substrate tape with the traces in a protective polymer compound and polymerizing the compound.

19. The method of claim 18 further including, after the step of encapsulating the chip, the step of attaching solder balls to the solder layers plated in the tape through-holes.

20. A method for fabricating a semiconductor device comprising the steps of:

attaching an adhesive film on a substrate tape;
opening through-holes through the film and the tape;
placing a metal foil on the adhesive film across the tape, thereby bridging the through-holes;
depositing a layer of photoresist on the metal foil;
positioning a photomask on the photoresist to define pads aligned with the through-holes center-to-center, and traces for interconnections;
exposing and developing the photoresist to create openings exposing portions of the metal foil;
positioning the substrate in an electrolytic copper plating tank so that the metal deposition rate on the foil portions exposed in the tape through-holes will be greater than the deposition rate on the foil portions exposed in the photoresist openings;

electroplating metal layers on the exposed foil portions, until the metal layers in the tape through-holes reach a first thickness equal, and the metal layers in the photoresist openings reach a second thickness smaller than the first thickness, thereby creating metal pads and traces, respectively;

removing the photoresist, thereby exposing the metal sidewalls of the pads and traces;

removing the portions of the metal foil not covered by the deposited metal;

depositing, exposing and developing a layer of soldermask on a portion of the tape to protect the pads and the traces of the portion;

electroplating a layer of solder on the metal surface in the tape through-holes, and on the surface and on the sidewalls of the traces unprotected by the soldermask, thereby creating metal traces having three solder-plated surfaces; and attaching a semiconductor chip having contact studs onto the traces unprotected by the soldermask.

* * * * *